US009793401B1

(12) United States Patent
Balakrishnan et al.

(10) Patent No.: US 9,793,401 B1
(45) Date of Patent: Oct. 17, 2017

(54) VERTICAL FIELD EFFECT TRANSISTOR INCLUDING EXTENSION AND STRESSORS

(71) Applicant: INTERNATIONAL BUSINESS MACHINES CORPORATION, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/164,046

(22) Filed: May 25, 2016

(51) Int. Cl.
| H01L 21/02 | (2006.01) |
| H01L 29/78 | (2006.01) |
| H01L 29/786 | (2006.01) |
| H01L 29/423 | (2006.01) |
| H01L 29/161 | (2006.01) |
| H01L 29/16 | (2006.01) |
| H01L 29/165 | (2006.01) |
| H01L 29/66 | (2006.01) |

(52) U.S. Cl.
CPC ........ H01L 29/7848 (2013.01); H01L 29/161 (2013.01); H01L 29/165 (2013.01); H01L 29/1608 (2013.01); H01L 29/42392 (2013.01); H01L 29/66666 (2013.01); H01L 29/78618 (2013.01); H01L 29/78642 (2013.01); H01L 29/78696 (2013.01)

(58) Field of Classification Search
CPC ........... H01L 29/7848; H01L 29/78696; H01L 29/1608; H01L 29/42392; H01L 29/66666; H01L 29/161; H01L 29/165; H01L 29/78642; H01L 29/78618
See application file for complete search history.

(56) References Cited

U.S. PATENT DOCUMENTS

| 9,484,439 | B1 * | 11/2016 | Cheng | H01L 29/66795 |
| 9,613,981 | B2 * | 4/2017 | Huo | H01L 27/11582 |
| 2009/0032841 | A1 * | 2/2009 | Eller | H01L 21/82380 |
| | | | | 257/190 |
| 2014/0264489 | A1 * | 9/2014 | Wong | H01L 29/785 |
| | | | | 257/288 |
| 2015/0372140 | A1 * | 12/2015 | Liu | H01L 29/7848 |
| | | | | 257/190 |
| 2016/0064541 | A1 * | 3/2016 | Diaz | H01L 29/66666 |
| | | | | 257/329 |
| 2016/0293761 | A1 * | 10/2016 | Liu | G06N 3/04 |
| 2016/0365456 | A1 * | 12/2016 | Liu | H01L 29/7883 |

* cited by examiner

*Primary Examiner* — Victor A Mandala
(74) *Attorney, Agent, or Firm* — Cantor Colburn LLP; Louis Percello

(57) ABSTRACT

A vertical field effect transistor (FET) includes a first source/drain region formed on an upper surface of a semiconductor substrate, and a semiconductor channel material that extends vertically from the first source/drain region to a second source/drain region. A metal gate structure encapsulating the semiconductor channel material. The vertical FET further includes a stressor region that contacts the semiconductor channel material and the first source/drain region. The combination of the semiconductor channel material and the stressor region defines a total length of a strained channel region of the vertical field effect transistor.

15 Claims, 20 Drawing Sheets

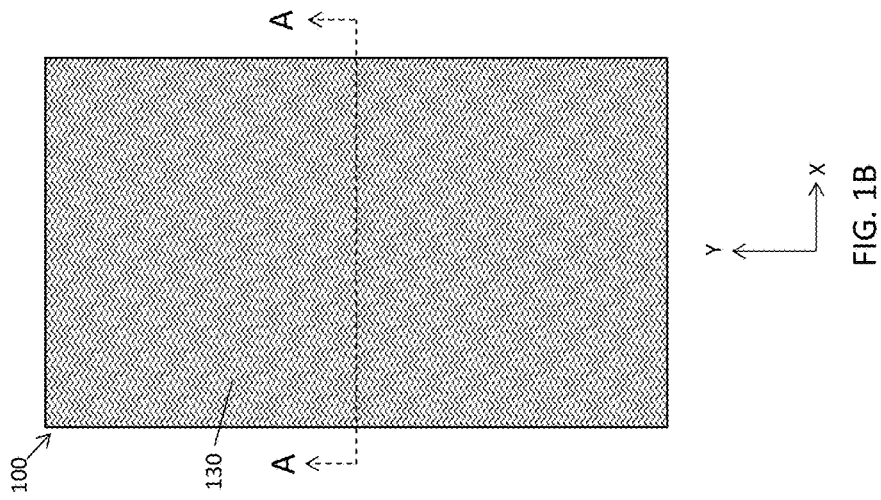
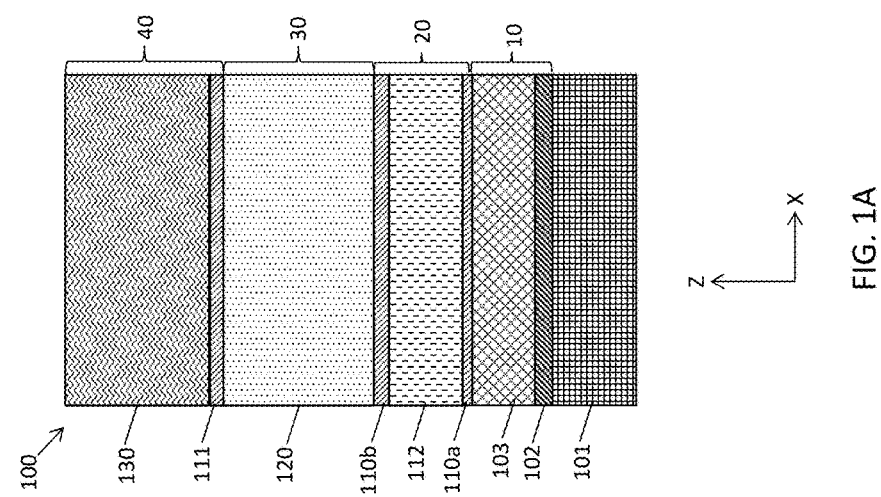

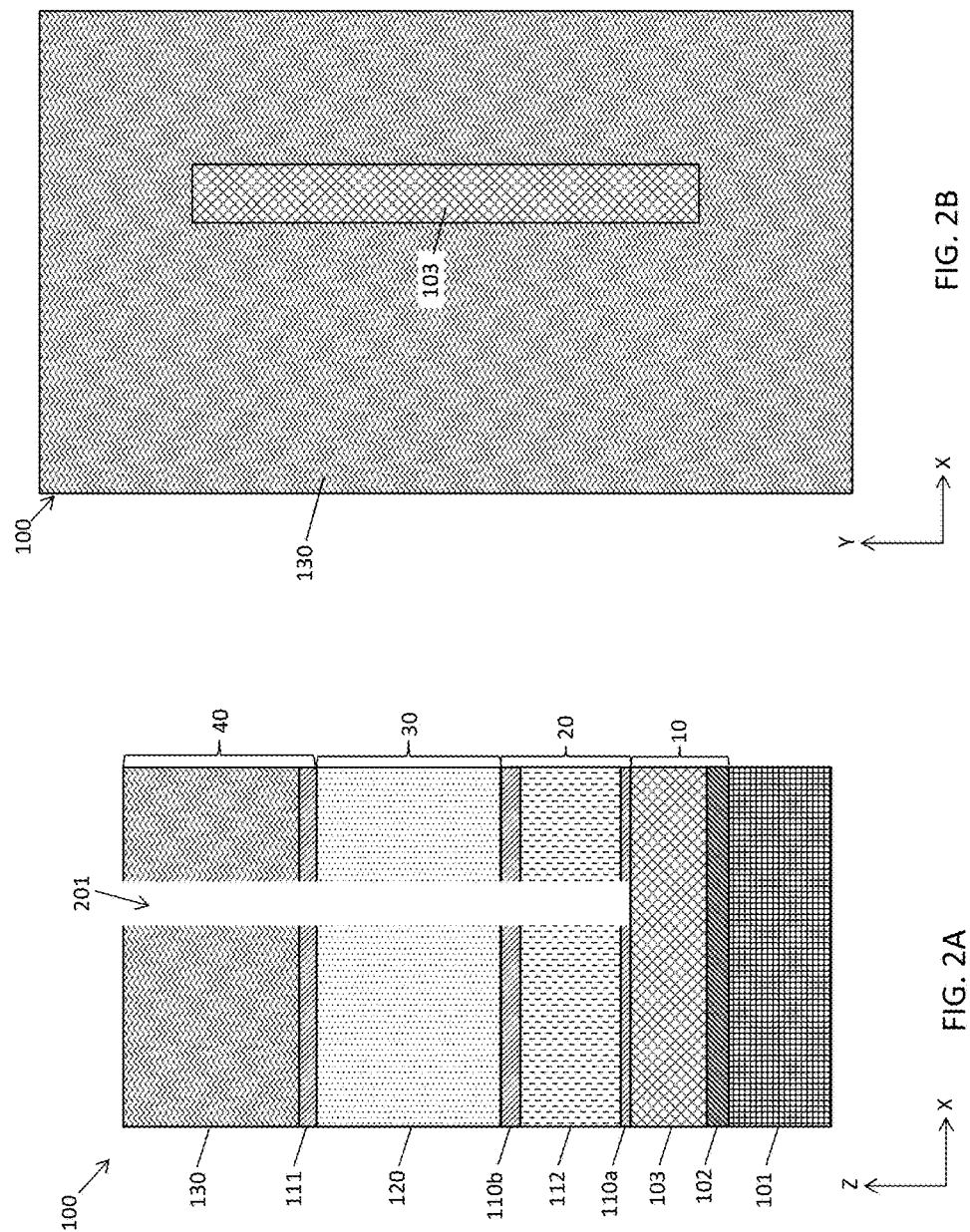

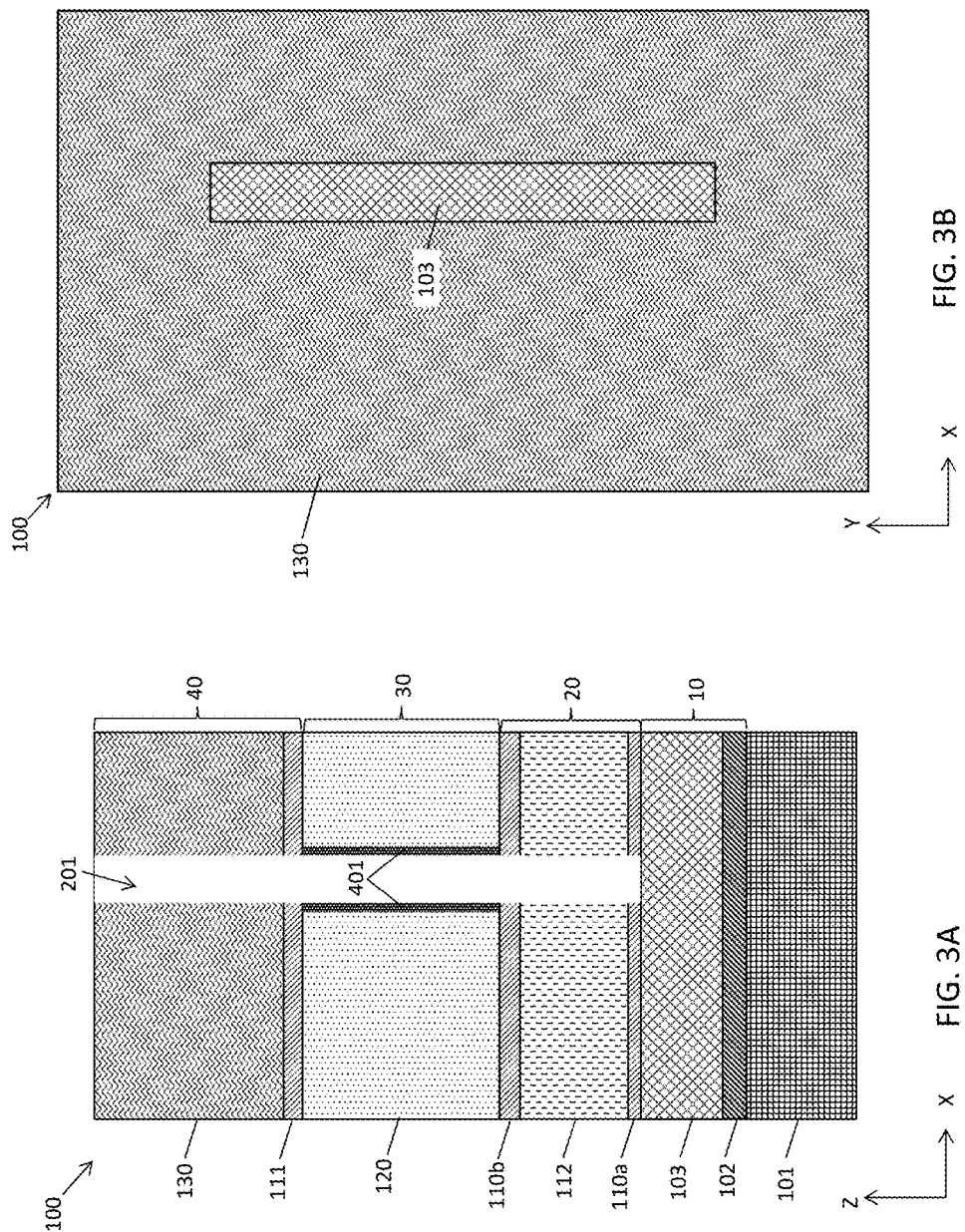

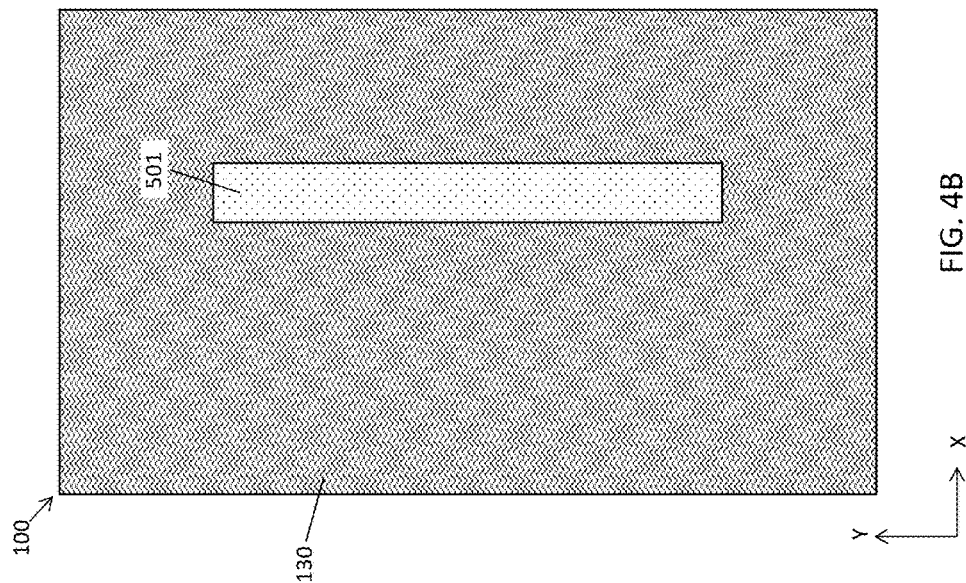
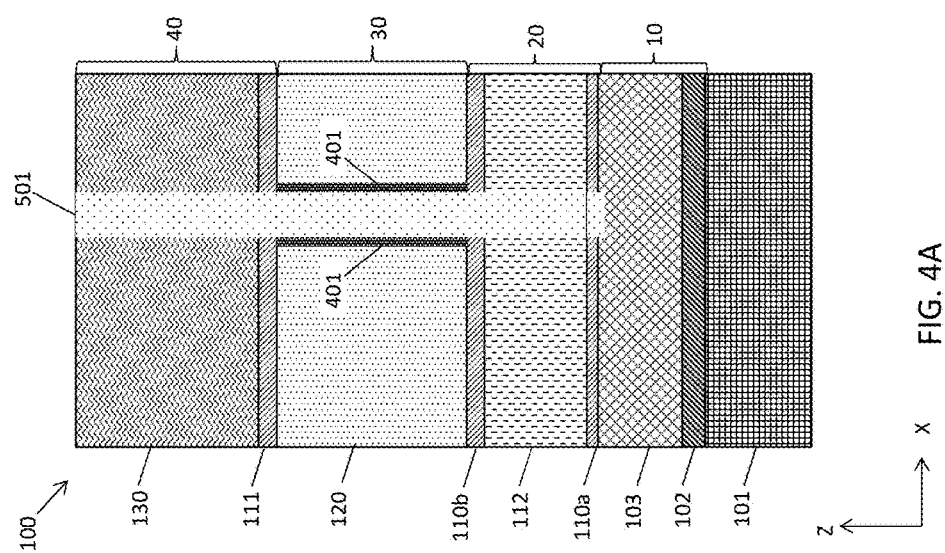
FIG. 4A
FIG. 4B

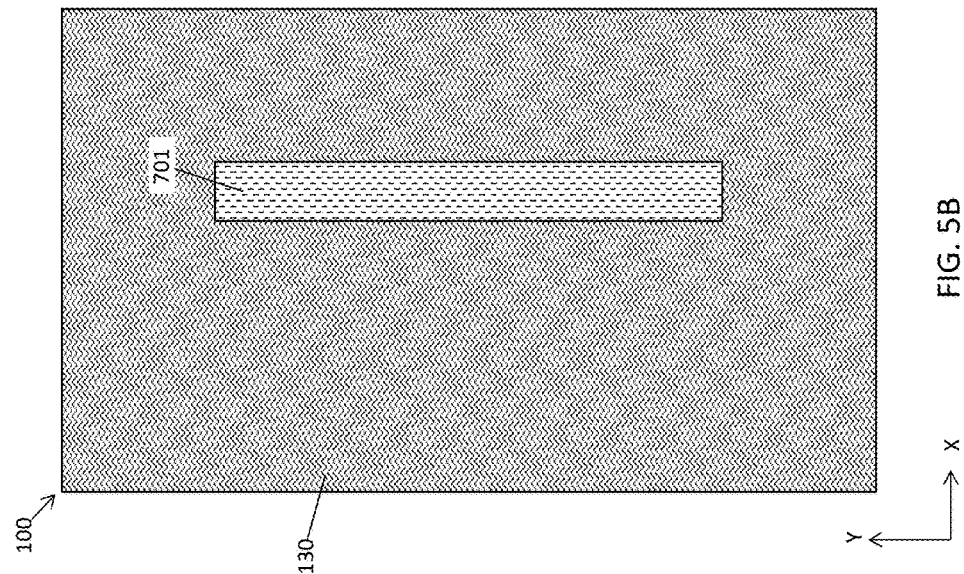
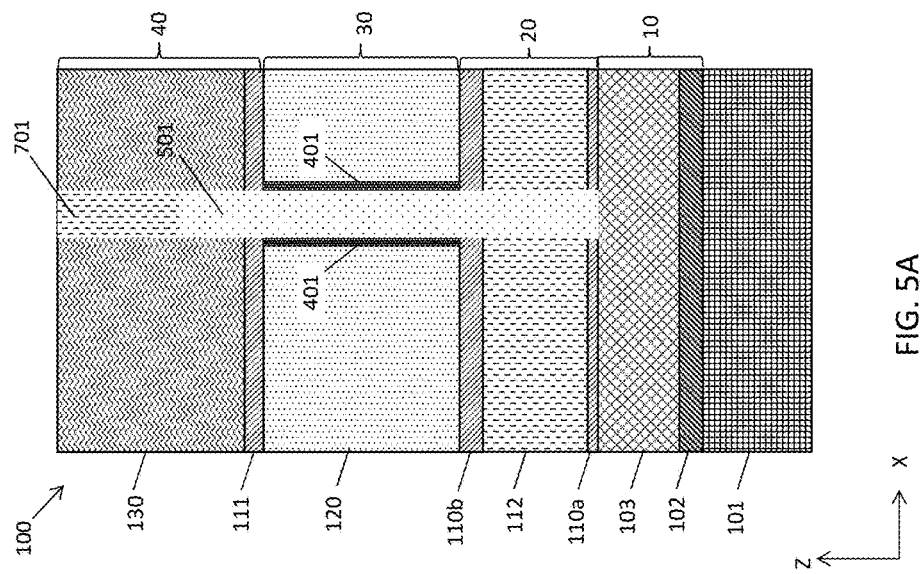
FIG. 5B
FIG. 5A

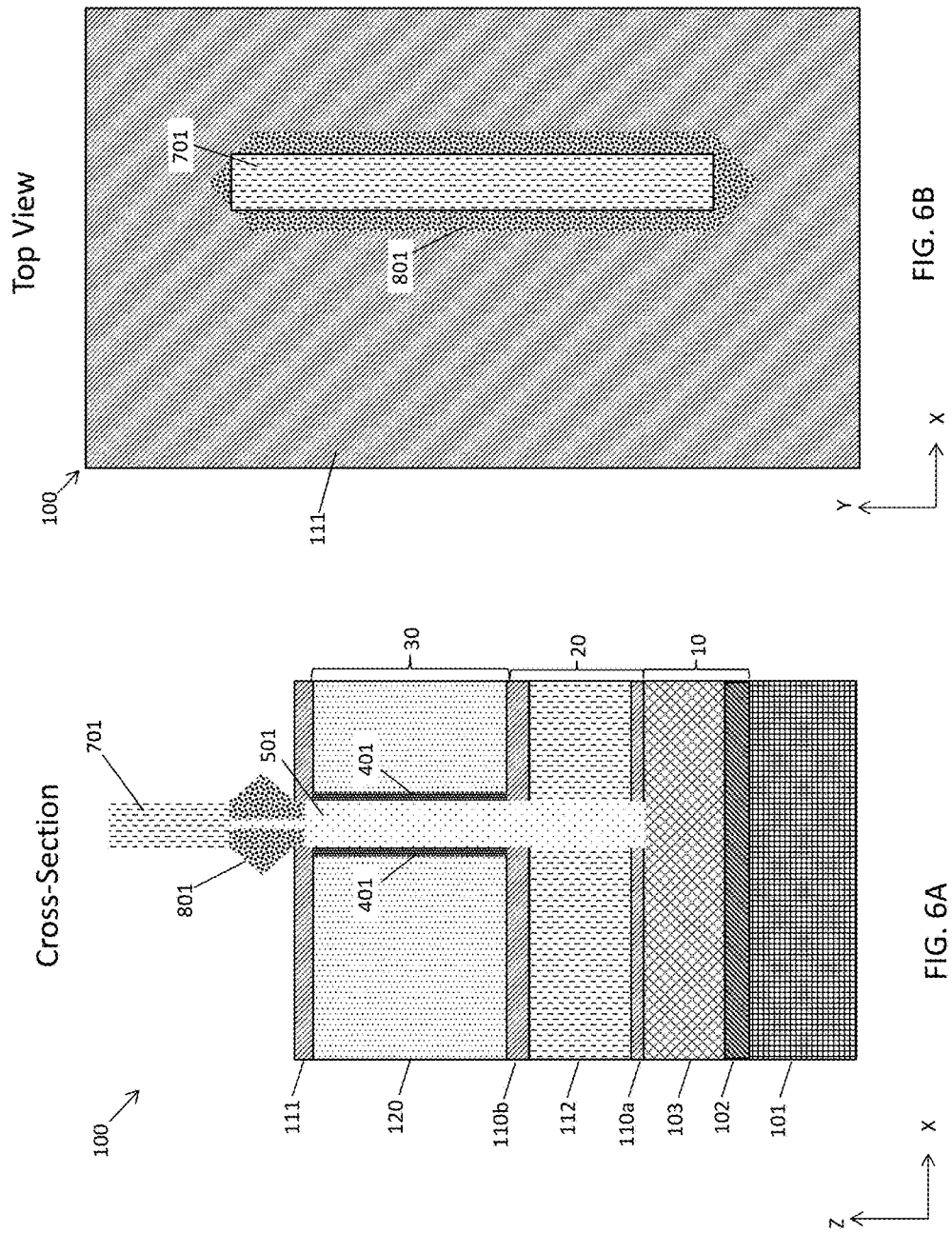

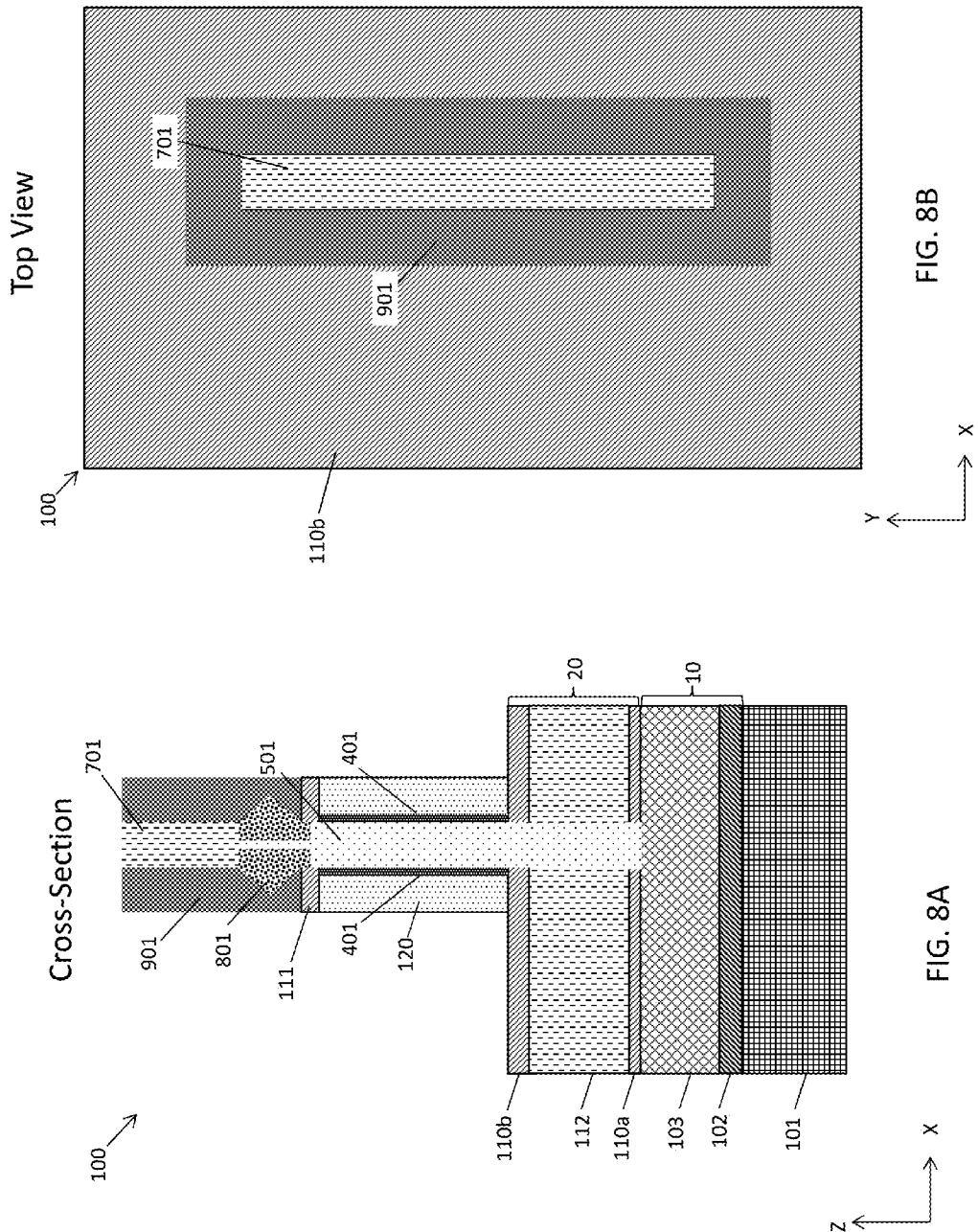

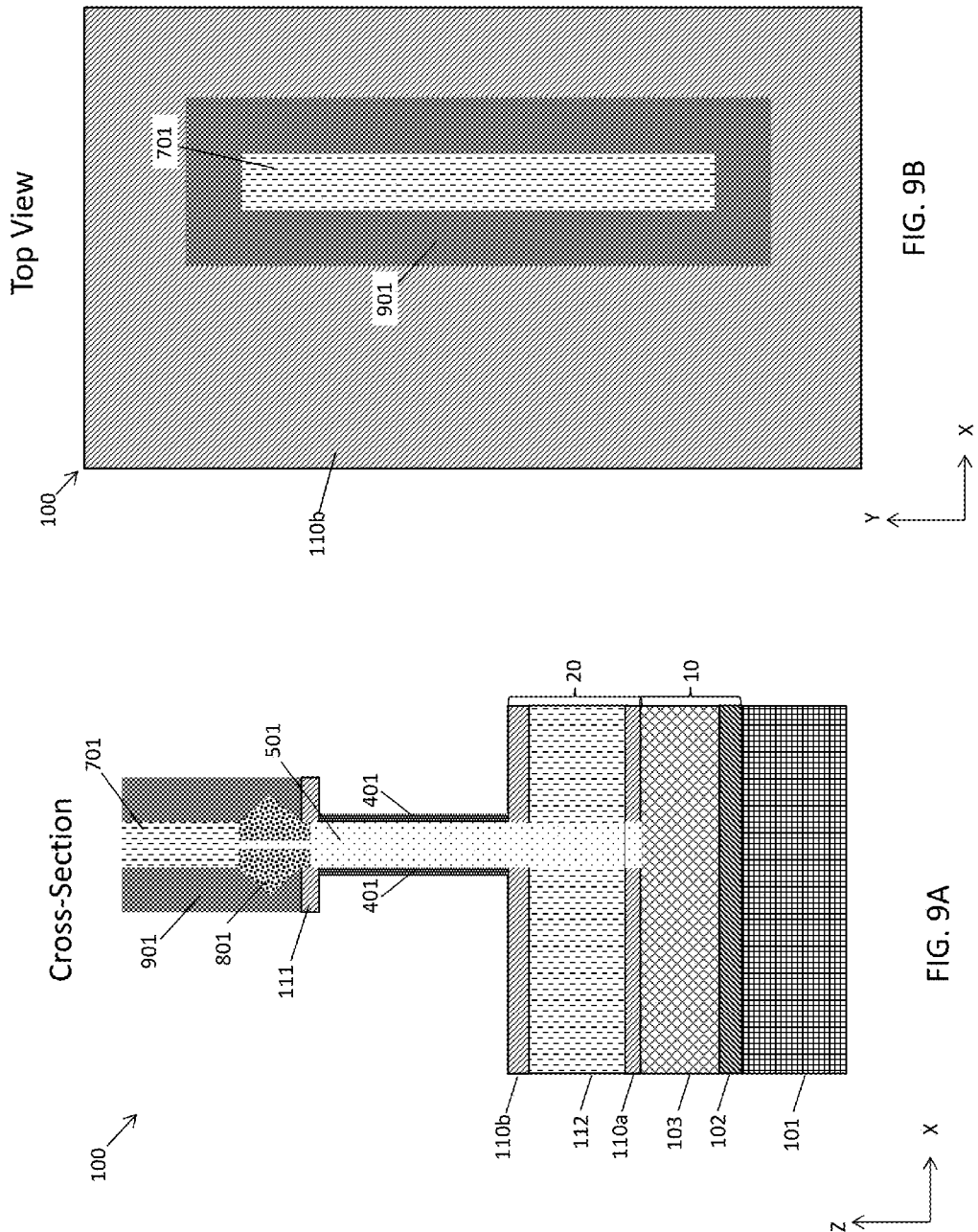

VERTICAL FIELD EFFECT TRANSISTOR INCLUDING EXTENSION AND STRESSORS

BACKGROUND

The present invention relates to field effect transistors (FETs), and more specifically, to vertical-type FETs.

As demands to reduce the dimensions of transistor devices continue, new designs and fabrication techniques to achieve a reduced device footprint are developed. Vertical-type field effect transistors (vertical FETs) have recently been developed to achieve a reduced FET device footprint without comprising the necessary FET device performance. Vertical FETs are fabricated such that source/drain (S/D) regions are arranged at opposing ends of a vertical channel region.

The vertical orientation of the vertical FET allows for controlling the voltage rating as a function of the doping and thickness of the epitaxial layer, while the current rating is controlled as a function of the channel width. Accordingly, a vertical FET may sustain both high blocking voltage and high current within a compact semiconductor substrate (e.g., silicon substrate). Vertical FETs may also allow for relaxed gate lengths to better control device electrostatics, without sacrificing the gate contact pitch size.

SUMMARY

According to a non-limiting embodiment of the present invention, a vertical field effect transistor (FET) includes a first source/drain region formed on an upper surface of a semiconductor substrate, and a semiconductor channel material that extends vertically from the first source/drain region to a second source/drain region. A metal gate structure encapsulating the semiconductor channel material. The vertical FET further includes a stressor region that contacts the semiconductor channel material and the first source/drain region. The combination of the semiconductor channel material and the stressor region defines a total length of a strained channel region of the vertical field effect transistor.

According to another non-limiting embodiment, a method of inducing a strain on a channel region of a vertical field effect transistor (FET) comprises removing an encapsulating structure to form a void that exposes a first portion of the channel region. The channel region has a first lattice constant. The method further includes selectively removing the first portion of the channel region while preserving a second portion of the channel region. The second portion has a first channel end connected to a first source/drain region and a second channel end exposed to the void. The method further includes forming a stressor region having a first stressor end formed against the second channel and a second stressor end formed against a second source/drain region. The stressor region has a second lattice constant different from the first lattice constant so as to induce a strain on the preserved second portion of the channel region.

According to yet another non-limiting embodiment, a method of inducing strain on a channel region of a vertical transistor comprises forming a channel region that extends from a first source/drain region to a second source/drain region, and encapsulating a first portion of the channel region with a first encapsulating structure and a second portion of the channel region with a second encapsulating structure. The method further comprises removing the second encapsulating structure while maintaining the first encapsulating structure to expose the second portion of the channel region, and replacing the second portion of the channel region with a stressor region that induces a strain on the first portion of the channel region.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features of the invention are apparent from the following detailed description taken in conjunction with non-limiting embodiments illustrated in the accompanying drawings. FIGS. 1A-20 are a series of views illustrating a method of forming a vertical FET device according to exemplary embodiments of the present teachings, in which:

FIGS. 1A-1B are a cross-sectional side view and a top view, respectively, of a starting semiconductor structure according to a non-limiting embodiment;

FIGS. 2A-2B illustrate the semiconductor structure of FIGS. 1A and 1B after forming a trench through the dielectric capping layer, a dummy gate layer, a counter-dielectric layer, and a lower intermediate spacer to expose a heavily-doped S/D layer;

FIGS. 3A-3B illustrate the semiconductor structure of FIGS. 2A-2B following an oxidation process that oxidizes a portion of the dummy gate sidewalls;

FIGS. 4A-4B illustrate the semiconductor structure of FIGS. 3A-3B after performing an epitaxial growth process that fills the trench with a semiconductor material to form a channel region;

FIGS. 5A-5B illustrate the semiconductor structure of FIGS. 4A-4B after partially recessing the epitaxial layer, and re-filling the trench with an upper dielectric material;

FIGS. 6A-6B illustrate the semiconductor structure of FIGS. 5A-5B following a selective etching process to remove the dielectric capping layer, and after performing an epitaxial growth process to grow an upper S/D region from the channel region;

FIGS. 8A-8B illustrate the semiconductor structure of FIGS. 7A-7B following a selective etching process that etches a portion of the upper spacer and a portion of the dummy gate layer while stopping on an upper surface of the lower intermediate spacer;

FIGS. 9A-9B illustrate the semiconductor structure of FIGS. 8A-8B after performing a selective etching process to remove remaining portions of the dummy gate;

FIG. 10 illustrates the semiconductor structure of FIGS. 9A-9B after removing the oxide sidewall portions, depositing a channel dielectric material and a work function metal layer on sidewalls of the channel region and the S/D spacers, and selectively etching the portions of the channel dielectric material and work function metal layer away from the S/D spacers;

FIG. 11 illustrates the semiconductor structure of FIG. 10 following a metal deposition process that deposits a metal gate material that encapsulates the channel dielectric material, a work function metal layer, and channel region;

FIG. 12 illustrates the semiconductor structure of FIG. 11 following a gate lithography and etching process that forms a gate structure and exposes an upper surface of the upper intermediate spacer layer;

FIG. 13 illustrates the semiconductor structure of FIG. 12 following deposition of an inter-layer dielectric (ILD) material on an upper surface of the upper intermediate spacer layer to surround the metal gate structure and the S/D spacers;

FIG. 14 illustrates the semiconductor structure of FIG. 13 following a lithography and patterning process to form a first S/D trench that extends through the ILD material and the upper intermediate spacer layer and into the intermediate dielectric layer;

FIG. 15 illustrates the semiconductor structure of FIG. 14 following a selective etching process to selectively remove the intermediate dielectric layer while maintaining the upper and lower intermediate spacers and the channel region;

FIG. 16 illustrates the semiconductor structure of FIG. 15 following a selective etching process that removes a portion of the channel region while maintaining the upper and lower intermediate spacers;

FIG. 17 illustrates the semiconductor structure of FIG. 16 following a channel sigma etching process that forms self-limiting cavities in the channel region and the heavily-doped S/D layer;

FIG. 18 illustrates the semiconductor structure of FIG. 17 following formation of a stressor region between the channel region and the heavily-doped S/D region;

FIG. 19 illustrates the semiconductor structure of FIG. 18 following a lithography and patterning process to form a first contact trench that extends through the ILD material and into a metal gate structure, and a second contact trench between the upper spacers that exposes the upper S/D region; and FIG. 20 illustrates the semiconductor structure of FIG. 19 after filling the first S/D trench, the gate trench and the second S/D trench with a metal material form a first S/D contact, a gate contact, and a second S/D contact.

DETAILED DESCRIPTION

Figures 7A, 7B:
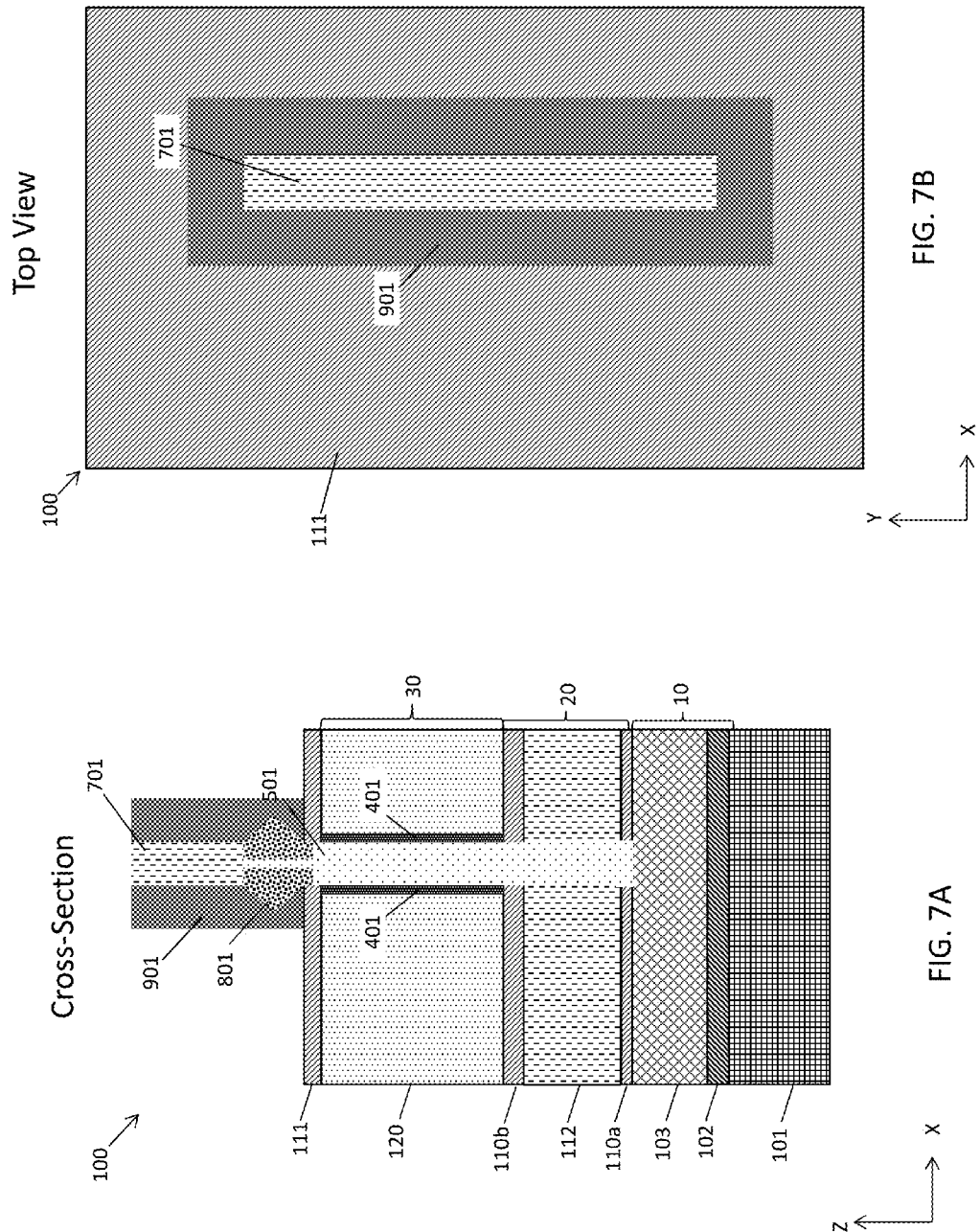
FIGS. 7A-7B illustrate the semiconductor structure of FIGS. 6A-6B following a spacer deposition process that forms spacers on an outer surface of the upper source/drain region and the upper dielectric material.

Various embodiments of the present disclosure are described herein with reference to the related drawings. Alternative embodiments may be devised without departing from the scope of this disclosure. It is noted that various connections and positional relationships (e.g., over, below, adjacent, etc.) are set forth between elements in the following description and in the drawings. These connections and/or positional relationships, unless specified otherwise, may be direct or indirect, and the present disclosure is not intended to be limiting in this respect. Accordingly, a coupling of entities may refer to either a direct or an indirect coupling, and a positional relationship between entities may be a direct or indirect positional relationship. As an example of an indirect positional relationship, references in the present disclosure to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

For the sake of brevity, conventional techniques related to semiconductor device and IC fabrication may not be described in detail herein. Moreover, the various tasks and process steps described herein may be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that may be utilized in implementing one or more embodiments of the present disclosure will now be provided. Although specific fabrication operations used in implementing one or more embodiments of the present disclosure may be individually known, the disclosed combination of operations and/or resulting structures of the present disclosure are unique. Thus, the unique combination of the operations described in connection with the fabrication of a coupler system according to the present disclosure utilize a variety of individually known physical and chemical processes performed on a semiconductor (e.g., silicon) substrate. In general, the various processes used to form a micro-chip that will be packaged into an IC fall into three categories, namely, film deposition, patterning, etching and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed discussion of one or more embodiments, fabrication of vertical FETs can be challenging because the vertical orientation causes variations in the gate length, spacer thickness and extension doping profile. Additionally, introducing strain in vertical FETs is also challenging because of the inherently relaxed channel material due to its vertical pillar-like geometry.

Various non-limiting embodiments of the invention utilize a sigma-etched channel region near the bottom terminal of the vertical FET so as to reduce the variations seen in conventional vertical FET fabrication processes. In addition, various non-limiting embodiments of the invention include an extension region, which allows for applying a strain to the channel region. The strain may be achieved by embedding an epitaxially grown stressor region between the channel region and the heavily doped source/drain region. The stressor region has a different lattice constant compared to the channel region material, which induces a strain (e.g., compressive or tensile) upon the channel region, thereby improving hole (or electron) mobility of the vertical FET.

With reference now to FIGS. 1A-1B, starting semiconductor structure 100 is illustrated according to a non-limiting embodiment. The starting semiconductor structure 100 extends along a first axis (e.g., a Z-axis) to define a vertical height, a second axis (e.g., an X-axis) to define a distance of a first side (i.e., a first side distance), and a third axis (Y-axis) to define a distance of a second side (i.e., a second side distance). A cross-section of the starting semiconductor structure 100 illustrated in FIG. 1B illustrates a plurality of regions 10-40 stacked atop a semiconductor substrate 101.

The semiconductor substrate 101 may include a bulk semiconductor (Si) substrate 101 or a semiconductor-on insulator substrate 101. The semiconductor material of the substrate 101 includes various semiconductor materials including, but not limited to, silicon (Si).

The plurality of stacked regions includes, a first S/D region 10 formed atop the semiconductor substrate 101, an intermediate dielectric region 20 formed atop the first S/D region 10, a sacrificial gate region 30 formed atop the intermediate dielectric region 20, and a capping region 40 formed atop the sacrificial gate region 30.

The first S/D region 10 includes a counter-doped layer 102 interposed between a heavily-doped source/drain layer 103 (e.g., a heavily doped source layer 103) and the semiconductor substrate 101. In at least one embodiment, the counter-doped layer 102 is formed directly on an upper surface of the semiconductor substrate 101, and the heavily-doped source layer 103 formed directly on the upper surface of the counter-doped layer 102. The heavily-doped source layer 103 and the counter-doped layer 102 are formed on the semiconductor substrate 101 by incorporating dopants into the semiconductor substrate 101 or forming an epitaxial growth layer on the semiconductor substrate 101. The heavily-doped source layer 103 is heavily doped with a dopant, which may be a p-type dopant (e.g., boron or gallium) or an n-type dopant (e.g., phosphorus or arsenic).

The counter-doped layer 102 includes a dopant that is different/opposite than the dopant in the heavily-doped source layer 103. For example, when the heavily-doped source layer 103 includes a p-type dopant, the counter-doped source layer 102 includes an n-type dopant, and when the heavily-doped source layer 103 includes an n-type dopant, the counter-doped source layer 102 includes a p-type dopant. The heavily-doped source layer 103 is heavily doped, including a dopant concentration in a range from about $10^{19}$ to about $10^{22}$ atoms/cm$^3$. The vertical thickness of the counter-doped source layer 102 may be in a range from about 5 to about 50 nanometers (nm), or from about 10 to about 20 nm. The vertical thickness of the heavily-doped source layer 103 may be in a range from about 50 to about 250 nm, or from about 100 to about 200 nm.

The intermediate dielectric region 20 includes an intermediate dielectric layer 112 interposed between a first spacer 110a (e.g., a lower intermediate spacer 110a) and a second spacer 110b (e.g., an upper intermediate spacer 110b). The intermediate dielectric layer 112 comprises a dielectric material different from the dielectric material of the intermediate spacers 110a-110b. The dielectric layer 112 may have a vertical thickness ranging, for example, from about 10 nm to about 100 nm.

The lower intermediate spacer 110a may be formed as a blanket layer over the heavily-doped source layer 103, and the upper intermediate spacer 110b may be formed as a blanket layer over the dielectric layer 112. The intermediate spacers 110a-110b may have a vertical thickness ranging, for example, from about 3 to about 15 nm. In another embodiment, the first spacer 110a may have a vertical thickness in a range from about 5 to about 10 nm.

In at least one embodiment, the intermediate spacers 110a-110b may comprise a material that has a relative dielectric constant value (e.g., k-value) of about 7-8. In other embodiments, the intermediate spacers 110a-110b include a material with a k-value of at least 7 or at least 8. The intermediate spacers 110a-110b and the intermediate dielectric layer 112 may be deposited by various processes including, but not limited to, chemical vapor deposition (CVD) or physical vapor deposition (PVD). In at least one embodiment, the lower and upper intermediate spacers 110a-110b comprise silicon nitride (SiN) while the intermediate dielectric layer 112 comprises boron nitride (BN). In this manner, the intermediate dielectric layer 112 may be selectively etched with respect (i.e., while maintaining) to one or more of the intermediate spacers 110a-110b as discussed in greater detail below.

The sacrificial gate region 30 includes a dummy gate 120 that is formed on an upper surface of the upper intermediate spacer 110b. The dummy gate 120 includes a sacrificial gate material, for example, amorphous silicon (aSi) or polycrystalline silicon (polysilicon). The sacrificial material may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof. The sacrificial material forming the dummy gate 120 has a vertical thickness, for example, ranging from about 10 nm to about 40 nm.

The capping region 40 includes a capping spacer 111 that is formed on an upper surface of the dummy gate 120, and a dielectric capping layer 130 that is formed on an upper surface of the capping spacer 111. The capping spacer 111 may be formed of an insulating material including, but not limited to, silicon dioxide, silicon nitride, SiOCN, or SiBCN. Other non-limiting examples of materials for the capping spacer 111 include dielectric oxides (e.g., silicon oxide), dielectric nitrides (e.g., silicon nitride), dielectric oxynitrides, or any combination thereof. The capping spacer 111 may have a vertical thickness ranging, for example, from about 3 nm to about 15 nm.

The dielectric capping layer 130 may comprise various dielectric materials including, but not limited to, silicon dioxide ($SiO_2$), tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The dielectric capping layer 130 has a vertical thickness in ranging, for example, from about 30 nm to about 200 nm.

Referring to FIGS. 2A-2B, the semiconductor structure 100 is illustrated after forming a trench 201 through the dielectric capping layer 130, the capping spacer 111, the dummy gate 120, and the intermediate dielectric region 20

(including the intermediate dielectric layer 112 and intermediate spacers 110a/110b) to expose the heavily-doped source layer 103.

The trench 201 is formed by performing using multiple etching processes. For instance, a lithographical mask layer (not shown) may be formed atop the dielectric capping layer 130 and patterned to define a desired location and pattern of the trench 201. Thereafter, a first etching process selective to the capping spacer 111 is performed to remove a portion of the dielectric capping layer 130 corresponding to the pattern of the mask layer. A second etching process selective to the dummy gate 120 is then performed to punch through the capping spacer 111. Accordingly, the upper surface of the dummy gate 120 can be exposed. A third etching process selective to the upper intermediate spacer 110b is then performed to extend the depth of the trench 201 through the dummy gate 120. Lastly, a fourth etching process selective to the heavily-doped source layer 103 is performed to punch through the lower intermediate spacer 110a. The resulting trench 201 therefore extends through a top surface of the dielectric capping layer 130 and down to the upper surface of the heavily-doped source layer 103. The width of the trench 201 may range, for example, from about 3 nm to about 20 nm. The depth of the trench 201 may range, for example, from about 50 nm to about 300 nm.

FIGS. 3A-3B illustrate the semiconductor structure following an oxidation process that oxidizes a portion of the dummy gate 120. In at least one embodiment, the oxidation process forms a thin oxide film 401 along sidewalls of the dummy gate 120. The oxidation may be performed by a plasma oxidation process or other oxidation process that forms a thin oxide 401 layer. The lateral width (i.e., the distance along the X-axis direction) of the oxide layer 401 may range, for example, from about 0.5 nm to about 2 nm.

Turning to FIGS. 4A-4B, an epitaxial growth process is performed to fill the trench 201 with a semiconductor material. In at least one embodiment, the channel material is a doped semiconductor material that is epitaxially grown from the heavily-doped source layer 103 to form the epitaxial channel 501, i.e., the channel region 501. The channel region 501 extends vertically from the heavily-doped S/D layer 103 and fills the trench 201 so as to extend through the lower intermediate spacer 110a, the dummy gate 120, the upper intermediate spacer 110b, and capping spacer 111. The epitaxial growth includes an epitaxial semiconductor material, and the epitaxial growth and/or deposition processes are selective to a semiconductor surface and do not deposit material on other surfaces, such as the oxide layer 401, the intermediate spacers 110a-110b or capping spacer 111. The epitaxial growth in the epitaxial channel region 501 extends over the dielectric capping layer 130.

The material of the channel region 501 may be grown using a suitable growth process, for example, chemical vapor deposition (CVD), liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

Based on the epitaxial growth process described above, the channel region 501 may comprise various materials including, but not limited to, silicon (Si), germanium (Ge), or a combination thereof (e.g., SiGe). The gas source for the deposition of epitaxial semiconductor material may include a silicon-containing gas source, a germanium-containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. An epitaxial germanium layer can be deposited from a germanium gas source that is selected from the group consisting of germane, digermane, halogermane, dichlorogermane, trichlorogermane, tetrachlorogermane, and combinations thereof. An epitaxial silicon germanium alloy layer can be formed utilizing a combination of such gas sources. Carrier gases like hydrogen, nitrogen, helium and argon can be used.

Referring to FIGS. 5A-5B, the semiconductor structure 100 is illustrated after partially recessing the material of the channel region 501, and re-filling the resulting trench with a dielectric material to form a channel cap 701. In at least one embodiment, the material of the channel region 501 may be partially recessed to a level that is still within the dielectric capping layer 130 and above the capping spacer 111. The material of the channel region 501 may be recessed, for example, using a timed reactive ion etching (RIE) process or a wet etch process. It should be appreciated that a planarization process may be performed after depositing the channel cap dielectric material such that the upper surface of the channel cap 701 is flush with the upper surface of the dielectric capping layer 130 as further illustrated in FIG. 5A.

The dielectric material of the channel cap 701 may comprise various materials including, but not limited to, a dielectric oxide (e.g., silicon oxide), a dielectric nitride (e.g., silicon nitride), a dielectric oxynitride, or any combination thereof. The channel cap 701 may be deposited using various deposition processes such as, for example, chemical vapor deposition (CVD) or physical vapor deposition (PVD).

Turning to FIGS. 6A-6B the semiconductor structure 100 is illustrated after performing an epitaxial growth process to grow an upper S/D region 801 from the channel region 501. In at least one embodiment, the upper S/D region 801, which in this example serves as a drain region 801, has a substantially smaller surface area than the heavily-doped lower S/D region 103, which in this example serves as the lower S/D region 103, which serves as a source of the FET. In at least one embodiment, the upper S/D region 801 may have a lateral width ranging, for example, from approximately 8 nm to approximately 30 nm, the lower S/D region 301 has a much larger lateral width ranging from approximately 30 nm to approximately 150.

The drain region 801 may be formed by first performing an etching process selective to the capping spacer 111, the channel region 501 and the channel cap 710. In this manner, a portion of the channel region 501 located between the channel cap 710 and the capping spacer 111 is exposed. Next, an epitaxially growth process is performed that grows an epitaxial material 801 from sidewalls of the exposed channel region 501. Accordingly, the epitaxially grown material may serve as an upper S/D region 801, which in this non-limiting embodiment is a drain region 801. Accordingly, the channel region 501 extends vertically from the heavily-doped lower S/D region 103 (e.g., the source region 103) to the upper S/D region 801 (e.g., the drain region 801).

In at least one embodiment, a portion of the epitaxial channel 501 located between the channel cap 701 and the capping spacer 111 may be recessed along sidewalls before epitaxially growing the drain region 801. Although the epitaxially grown material 801 is discussed in terms of forming a drain region, it should be appreciated that the epitaxially grown material 801 may serve as a source region while the heavily-doped S/D region 103 serves as the drain region. The epitaxy process used to form the drain region 801 may be carried out using various well-known techniques including, but not limited to, vapor phase epitaxy (VPE), molecular beam epitaxy (MBE) or liquid phase epitaxy (LPE) with a gaseous or liquid precursor, such as, for example, silicon tetrachloride.

Turning now to FIGS. 7A-7B, the semiconductor structure 100 is illustrated following a spacer deposition process that forms S/D spacers 901 on an outer surface of the drain region 801 and channel cap 701. The S/D spacers 901 may therefore serve to protect the drain region 801 when performing subsequent fabrication operations discussed in greater detail below.

The S/D spacers 901 comprise an insulating material including, but not limited to, dielectric oxides (e.g., silicon oxide), dielectric nitrides (e.g., silicon nitride), dielectric oxynitrides, or any combination thereof. The material of the spacers may be deposited using various deposition processes such as, for example, chemical vapor deposition (CVD) or physical vapor deposition (PVD). In at least one embodiment, a subsequent etching process selective to the channel cap material may be performed. In this manner, the S/D spacers 901 may be recessed to expose the upper surface of the channel cap 701. The S/D spacers 901 have a lateral width (i.e., extending perpendicular to the Z-axis) ranging, for example, from about 5 nm to about 50 nm.

With reference now to FIGS. 8A-8B, the semiconductor structure 100 is illustrated following a selective etching process that etches a portion of the capping spacer 111 and a portion of the dummy gate layer 120 while stopping on an upper surface of the lower intermediate spacer 110b. Although not illustrated, a masking layer may be deposited on an upper surface of the S/D spacers 901 and the channel cap 701. In this manner, one or more selective etching process such as, for example, one or more RIE processes may be performed to etch portions of the capping spacer 111 and the dummy gate so as to expose upper surface of the upper intermediate spacer 110b as further illustrated in FIGS. 8A-8B. By deposing a mask (not shown) on the upper surface of the S/D spacers 901 and the channel cap 701, portions of the dummy gate 120 remain arranged on sidewalls of the channel region 501.

Turning to FIGS. 9A-9B, the semiconductor structure 100 is illustrated after removing the remaining portions of the dummy gate 120. The remaining portion of the dummy gate 120 are removed by performing a lateral etching process that is selective to the material of the oxide sidewalls 401, the intermediate spacers 110a-110b and the S/D spacers 901. Accordingly, the oxide sidewalls 401 are exposed. In at least one embodiment, the dummy gate 120 may be removed using a wet etch process, for example, that includes hot ammonia.

Figure 10:
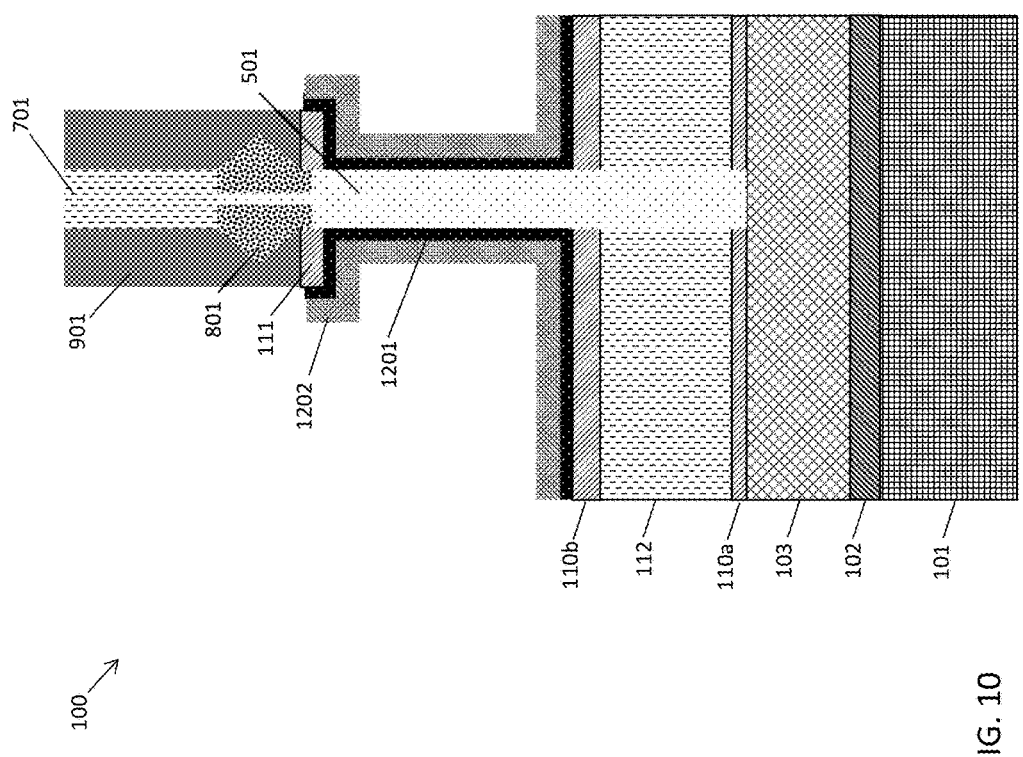

Referring to FIG. 10, the semiconductor structure 100 is illustrated after depositing a dielectric material 1201 and a work function metal 1202. The dielectric material 1201 and the work function metal 1202 form a portion of the gate stack (metal gate) that replaces the dummy gate 120. In at least one embodiment, the gate dielectric material 1201 may be initially deposited to conform to the outer surfaces of the upper intermediate spacer 110a, the channel region 501, the S/D spacers 901, and the upper surface of the channel cap 701. The work function metal 1202 is then deposited on the dielectric material 1201, Accordingly, the dielectric material 1201 and work function metal 1202 are formed against the sidewalls of the channel 501 such that the dielectric material 1201 is in direct contact with the channel region 501, and is interposed between the channel region 501 and the work function metal 1202.

The gate dielectric material(s) can be a dielectric material having a dielectric constant greater than 3.9, 7.0, or 10.0. Non-limiting examples of suitable materials for the gate dielectric material 1201 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric material 1201 layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material 1201 may vary depending on the deposition process as well as the composition and number of high-k dielectric materials used.

The material composition of the work function metal(s) 1202 may be based on the type of semiconductor device (e.g., transistor) to be formed. Non-limiting examples of suitable work function metals 1202 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) 1202 may be deposited by a suitable deposition process, for example, CVD, PECVD, PVD, plating, thermal or e-beam evaporation, and sputtering.

In at least one embodiment, the gate dielectric material 1201 and work function metal 1202 may be partially removed to re-expose the S/D spacers 901 as further illustrated in FIG. 10. An anisotropic etch may be performed to remove the gate dielectric material 1201 and the work function metal 1202 from surfaces of the S/D spacer 901 and dielectric material 1201. In at least one embodiment, the anisotropic etch may be, for example, a RIE process. After etching, the gate dielectric material 1201 and work function metal 1202 located between the heavily-doped source layer 103 and the drain region 801. In at least one embodiment, the gate dielectric material 1201 and work function metal 1202 is confined between the drain region 801 and the upper intermediate spacer 110b.

Figure 11:
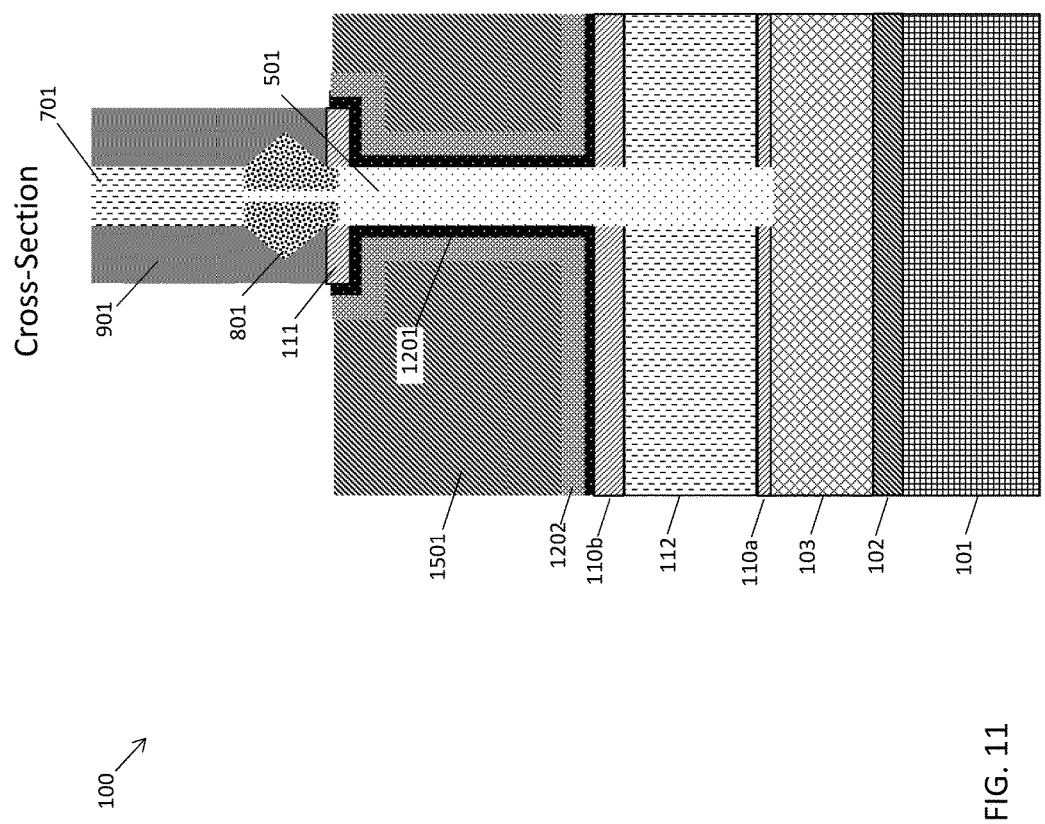

With reference to FIG. 11, the semiconductor structure 100 is illustrated after depositing a metal gate material 1501 that encapsulates a portion of the channel region 501 lined with the gate dielectric material 1201 and the work function metal 1202. In at least one embodiment, the metal gate contact material 1501 is blanket deposited on the upper surface of the work function metal 1202 to cover the S/D sidewalls 901 and the channel cap 701. Thereafter, the metal gate contact material 1501 is recessed until reaching the gate dielectric material 1201 and the work function metal 1202 as illustrated in FIG. 11.

The metal gate material 1501 is a conductive gate metal that is deposited over the gate dielectric material(s) 1201 and work function metals 1202 to form the gate stack. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering.

Figure 12:
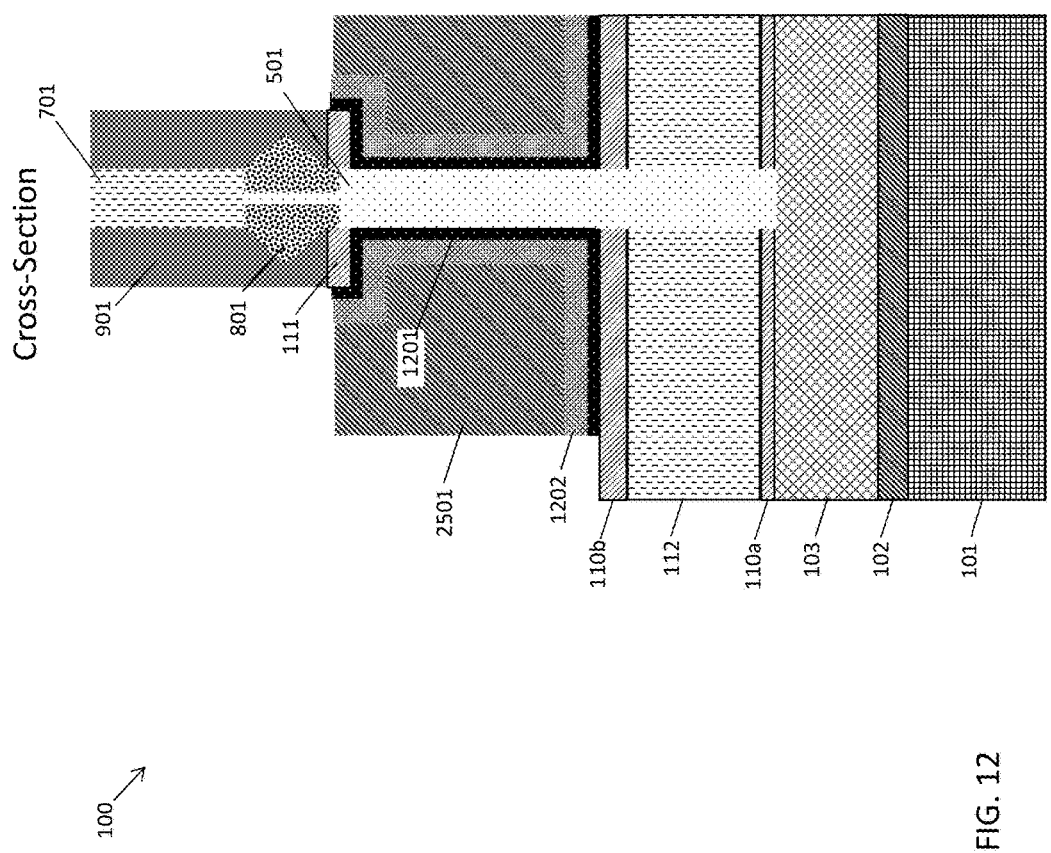

Turning now to FIG. 12, the semiconductor structure 100 is illustrated following a gate lithography and etching process that forms a metal gate 2501 and exposes an upper surface of the upper intermediate spacer layer 110b. In at least one embodiment, a mask (not shown) may be disposed on the metal gate material 1501 and subsequently patterned. The pattern is transferred into the metal gate material 1501 to define the final metal gate 2501. In addition, the gate dielectric material 1201 and work function metal 1202 may also be etched during this operation using a combination of RIE processes. As further illustrated in FIG. 12, a portion of the lower intermediate spacer 110a is formed between the metal gate 2501 and the heavily-doped source layer 103. It should be appreciated that the combination of the metal gate contact 501, the gate dielectric material(s) 1201, and the work function metals 1202 may define a metal gate structure (i.e., metal gate stack) which replaces the dummy gate 120 and is arranged in contact with the channel region 501.

Figure 13:
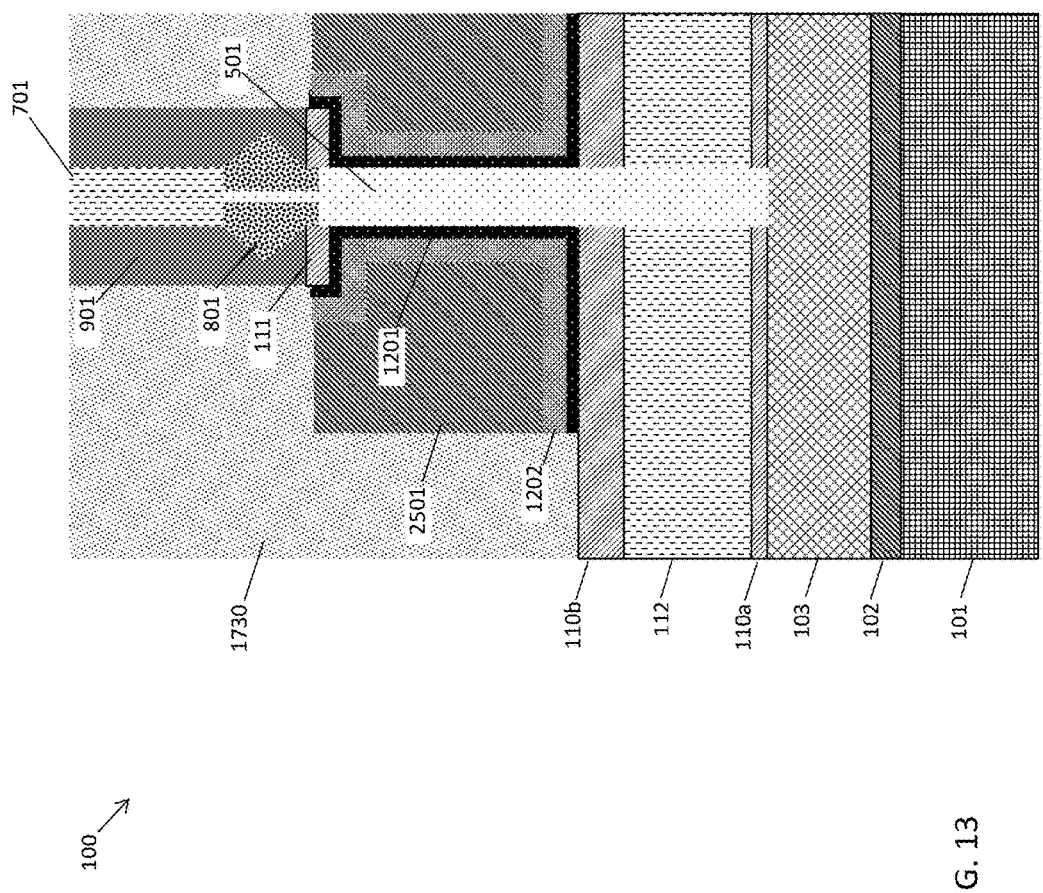

Referring to FIG. 13, the semiconductor device 100 is illustrated following deposition of an inter-layer dielectric (ILD) material 1730 on an upper surface of the upper intermediate spacer layer 110b to surround the metal gate stack (i.e., the metal gate contact) 501, the metal the gate dielectric material(s) 1201 and work function metals 1202) and the S/D spacers 901. The ILD material 1730 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The ILD material 1730 is deposited by a deposition process, including, but not limited to CVD, PVD, plasma enhanced CVD, atomic layer deposition (ALD), evaporation, chemical solution deposition, or like processes.

Figure 14:
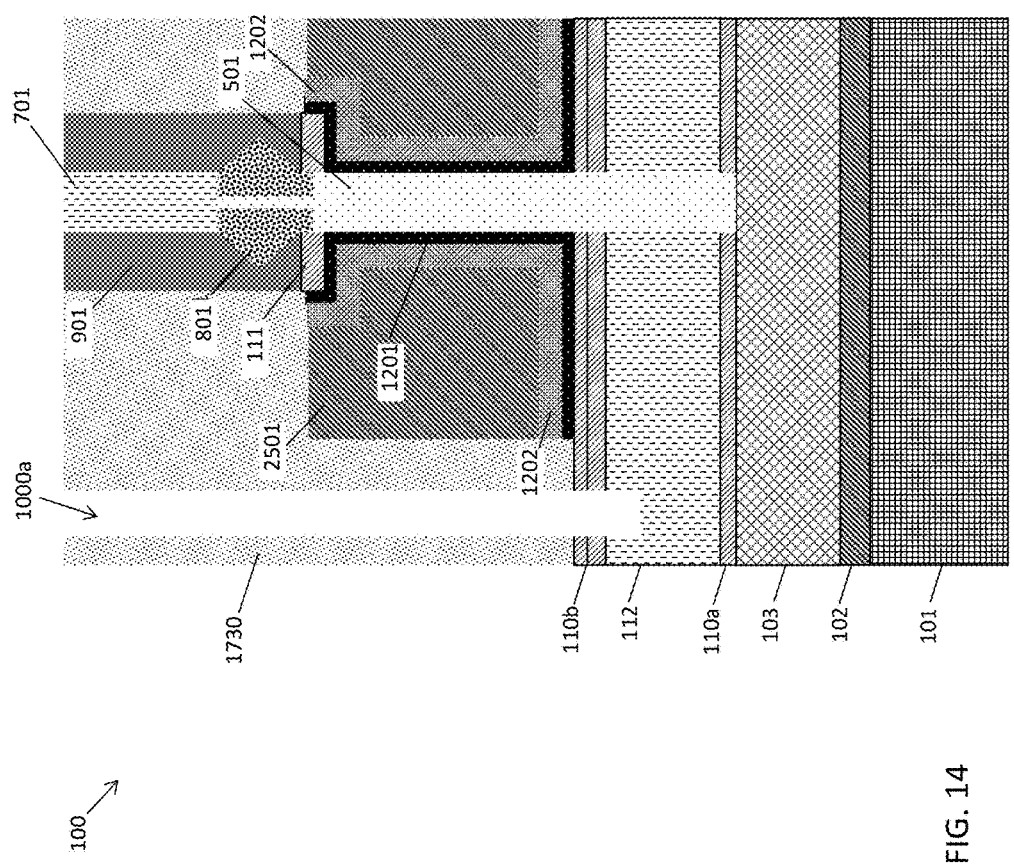

With reference now to FIG. 14, a lithography and patterning process is performed to form a first contact trench 1000a (e.g., a first S/D trench 1000a) that extends through both the ILD material 1730 and the upper intermediate spacer layer 110b, and into the intermediate dielectric layer 120. According to at least one embodiment, a resist, such as a photoresist, may be deposited and patterned to remove the ILD 1730 and form the first S/D trench.

Figure 15:
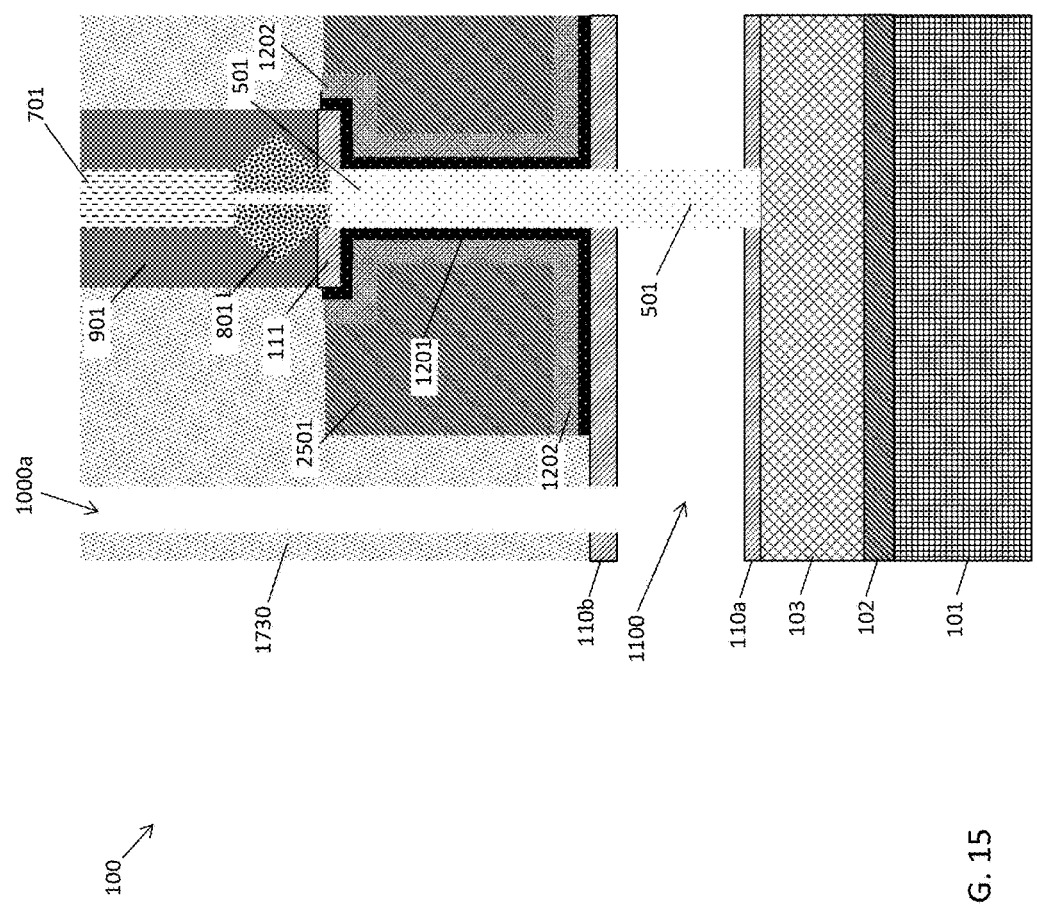

Turning now to FIG. 15, the semiconductor device 100 is illustrated following a selective etching process to selectively remove the intermediate dielectric layer 120. In at least one embodiment, an etching process may be performed which selectively attacks the intermediate dielectric layer 120 while preserving the materials of the remaining semiconductor device 100. Accordingly, a void 1100 is formed in the semiconductor structure 100 which exposes a portion of the channel region 501. With respect to the channel cap 701, the dielectric material of the intermediate dielectric layer 120 may comprise a first dielectric material while the channel cap 701 comprises a second dielectric material different form the first dielectric material. After completing the selective etching process, the portion of the channel region 501 located between the lower and upper intermediate spacers 110a-110b is exposed as further illustrated in FIG. 15.

In at least one embodiment, the intermediate dielectric layer 120 and the channel cap 701 may comprise the same dielectric material. In this case, a mask layer (not shown) may be deposited over the channel cap 701. In this manner, the channel cap 701 may be protected while selectively etching the intermediate dielectric layer 120 with respect to (i.e., while maintaining) the remaining materials of the semiconductor structure 100.

Figure 16:
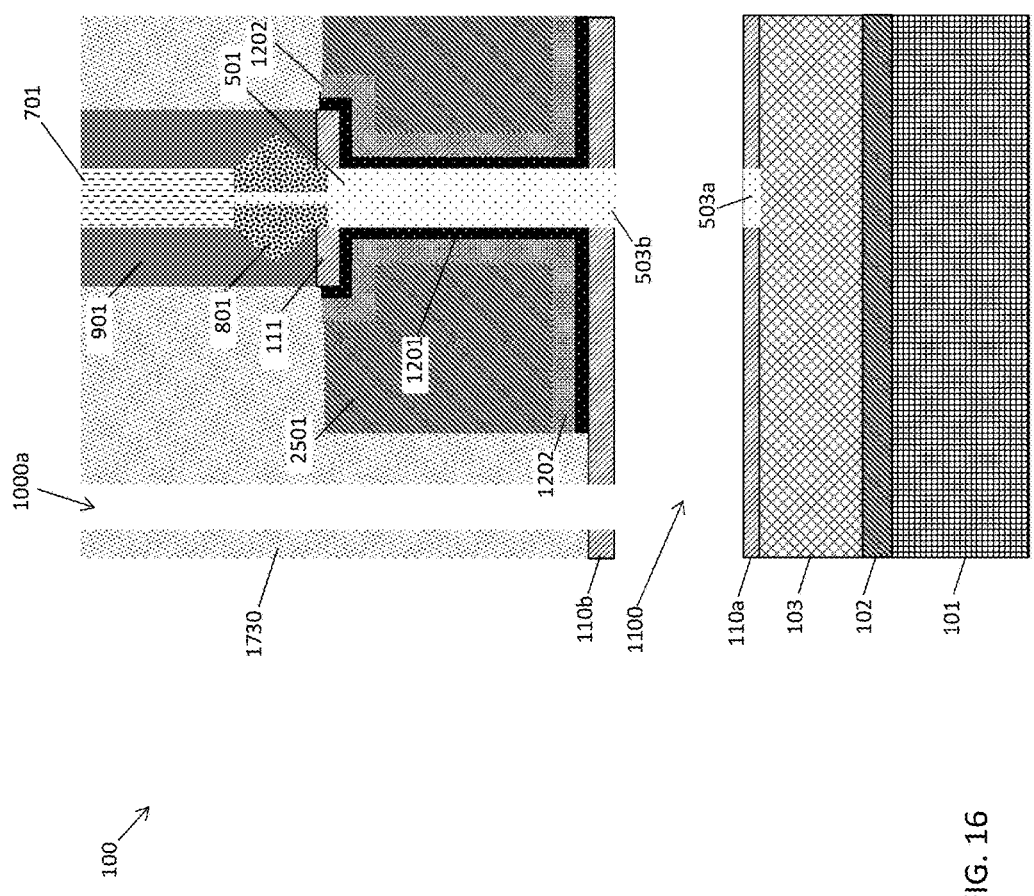

Referring to FIG. 16, the semiconductor structure 100 is illustrated following a selective etching process that removes the exposed portion of the channel region with respect to (i.e., while maintaining) the lower and upper intermediate spacers 110a-110b. In at least one embodiment, a wet etch process selective to the material of the channel region 501 (e.g., an epitaxially grown semiconductor material) is performed. In this manner, a first remaining channel portion 503a (e.g., a lower remaining channel portion 503a) is partially surrounded by the lower intermediate spacer 110a while a second remaining channel portion 503b (e.g., an upper remaining channel portion 503b) is partially surrounded by the upper intermediate spacer 110b as further illustrated in FIG. 16.

Figure 17:
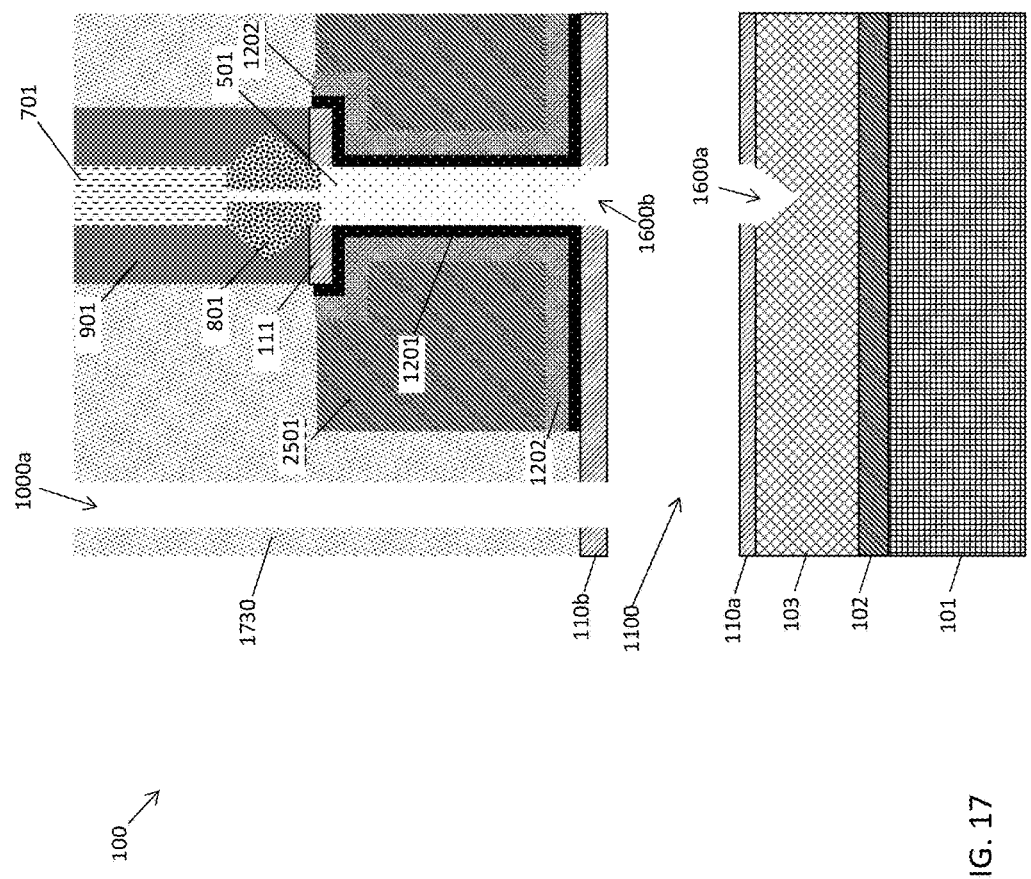

With reference now to FIG. 17, the semiconductor structure 100 is illustrated following a channel sigma etching process. In at least one embodiment, the channel sigma etching process includes a wet etch such as Tetramethylammonium hydroxide (TMAH), for example, which self-limits to a point so as to form self-limiting cavities (e.g., v-grooves) in the channel region and the heavily-doped S/D layer. The sigma etching processes more aggressively material in the <111> facet-plane with respect to material in the <110> facet-plane. In this manner, etching depth into the channel region 501 may be more precisely controlled.

For instance, the sigma etch applied to the lower remaining channel portion 503a self-limits to form a lower v-groove 1600a that extends from an upper portion of the lower intermediate spacer 110a into the heavily-doped source layer 103, while the sigma etch applied to the upper remaining channel portion 503b self-limits (i.e., self-terminates) to form an upper v-groove 1600b that extends from the surface of the upper intermediate spacer 110b into the remaining channel region 501 as further illustrated in FIG. 17. The self-limiting depth of the lower and upper v-grooves 1600a-1600b are controlled by the lateral width of the initial channel region 501. For instance, a larger channel region width correlates to a larger self-limiting depth. In at least one embodiment, the vertical width of the upper intermediate spacer 110b may control the depth of the upper v-groove 1600b. The depth of lower v-groove 1600a may range, for example, from approximately 4 nm to approximately 15 nm, and the depth of upper v-groove 1600b may range, for example, from approximately 4 nm to approximately 15 nm. In at least one embodiment, the v-grove is etched, for example, using hydrogen chloride (HCl) or Ammonia ($NH_3$).

Figure 18:
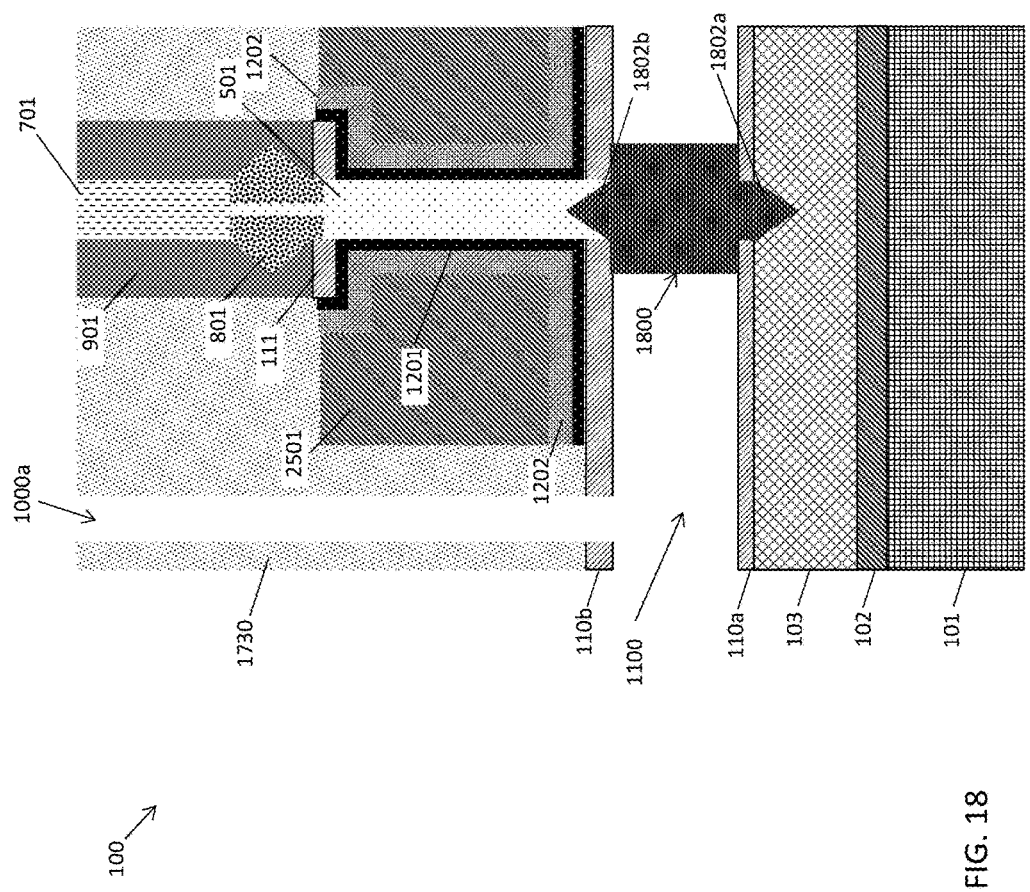

Turning to FIG. 18, the semiconductor structure 100 is illustrated after forming a stressor region 1800 between the channel region 501 and the heavily-doped source layer 103. The stressor region 1800 induces a strain (e.g., compressive or tensile) on the channel region 501. That is, semiconductor material of the stressor region 1800 has a lattice constant that is different from the lattice constant of the channel region 501 so as to induce a strain on the channel region. By straining the channel region 501, hole or electron mobility through the channel region 501 may be improved.

As described above, the stressor region 1800 fills both the lower v-groove (previously indicated as 1600a) and the upper v-groove (previously indicated as 1600b). Accordingly, the stressor region 1800 includes a lower v-shaped end 1802a that extends into the heavily-doped layer 103 and an upper v-shaped end 1802b that extends into the channel region 501. In this manner, the combination of the remaining channel region 501 and the stressor region 1800 defines the total length of a strained channel region of the semiconductor structure 100 (e.g., vertical field effect transistor).

In at least one non-limiting embodiment, the stressor region 1800 is formed by epitaxially growing a strain-inducing material from the heavily-doped source layer 103 exposed by the lower v-groove 1600a and from the channel region 501 exposed by the upper v-groove 1600b. The strain-inducing material includes a doped semiconductor material having a lattice constant different form the lattice constant of the channel region 501. When fabricating a p-FET device, for example, the channel region 501 may comprise Si, while the strain-inducing material comprises doped silicon germanium (SiGe) to induce a compressive strain on the channel region 501. When fabricating a n-FET device, for example, the channel region 501 may comprises Si, while the strain-inducing material comprises doped carbon doped silicon (Si:C) to induce a tensile strain on the channel region 501. The germanium concentration (e.g., atomic concentration) can range from 20% to 85% in the silico-germanium. The carbon concentration (atomic concentration) can range from 0.5% to 2.5% in the Si:C.

In another embodiment, the stressor region 1800 is formed by performing an atomic layer deposition (ALD) process to deposit the doped strain-inducing material to file the lower and upper v-grooves 1600a-1600b. After the doped strain-inducing material is deposited, an anneal process may be performed to induce the strain upon the channel region 501.

Figure 19:
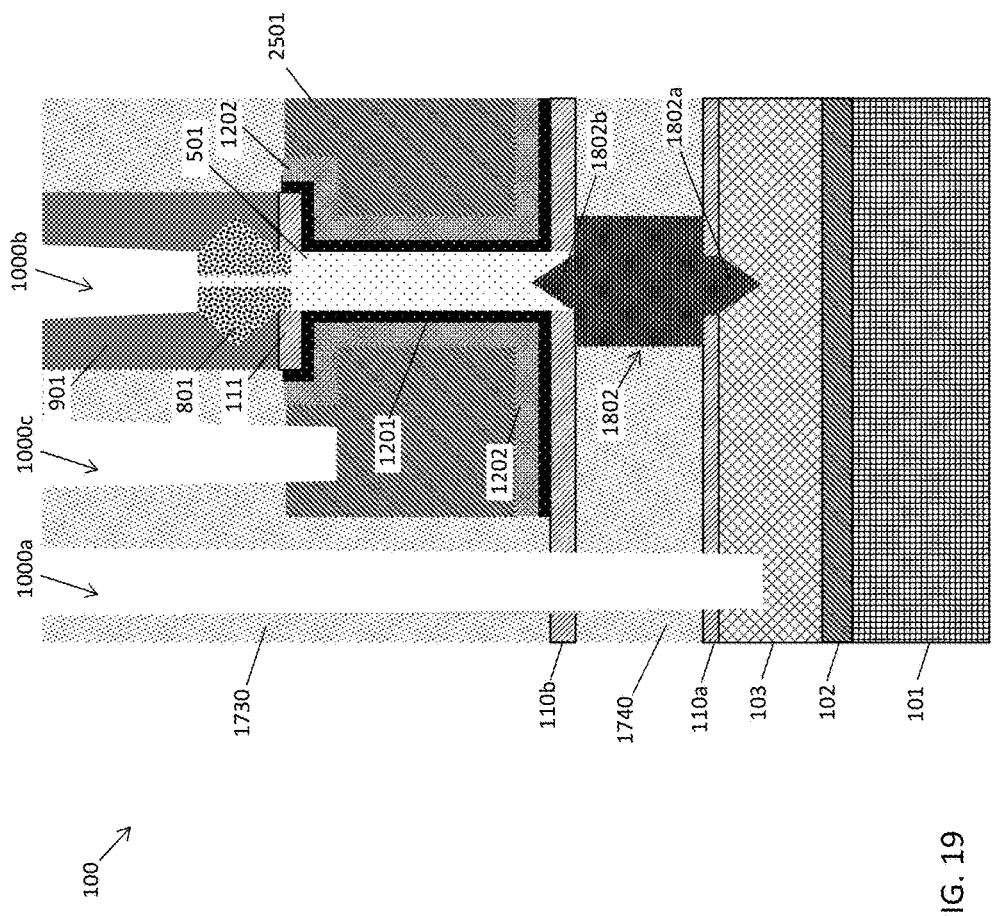

With reference to FIG. 19, the void (previously indicated as element 1100) is filled with a second ILD layer 1740. Accordingly, the second ILD layer 1740 is deposited between the lower and upper intermediate spacers 110a-110b to encapsulate the stressor region 1800. The ILD layer 1740 may comprise a low-k dielectric material (with k<4.0), including but not limited to, silicon oxide, spin-on-glass, a flowable oxide, a high density plasma oxide, borophosphosilicate glass (BPSG), or any combination thereof. Various deposition processes may be used to apply the second ILD layer 1740 including, but not limited to CVD, PVD, plasma enhanced CVD, atomic layer deposition (ALD), evaporation, chemical solution deposition, or like processes.

After depositing the second ILD layer, 1740 a lithography and patterning process is performed to form contact trenches as further illustrated in FIG. 19. The contact trenches serve to define the dimensions of metal contact vias which are described in greater detail below. Formation of the contact trenches includes extending the depth of the first S/D trench 1000a into the heavily-doped source layer 103. In at least one embodiment, a single timed etch may be used to extend the first S/D trench 1000a through the second ILD layer 1740 and the lower intermediate spacer 110a to expose the heavily-doped source layer 103. Alternatively, a first etching processes selective to a spacer material may be used first etch through the second ILD layer 1740 while a second etching process selective to a semiconductor material may be used to punch through the lower intermediate spacer 110a. Thereafter, a timed etching process may be used to extend the first S/D trench 1000a into the heavily-doped source layer 103.

Still referring to FIG. 19, a second contact trench 1000b (e.g., a gate trench 1000b) and a third contact trench 1000c (e.g., a second S/D trench 1000c) are also formed. The gate trench 1000b extends through the first ILD material 1730 and into a metal gate structure metal gate 2501. The second S/D trench 1000c is formed in between the S/D spacers 901 so as to expose the drain region 801. The gate trench 1000b and the second S/D trench 1000c may be formed using similar procedures described above with respect to the first S/D trench 1000a.

Figure 20:
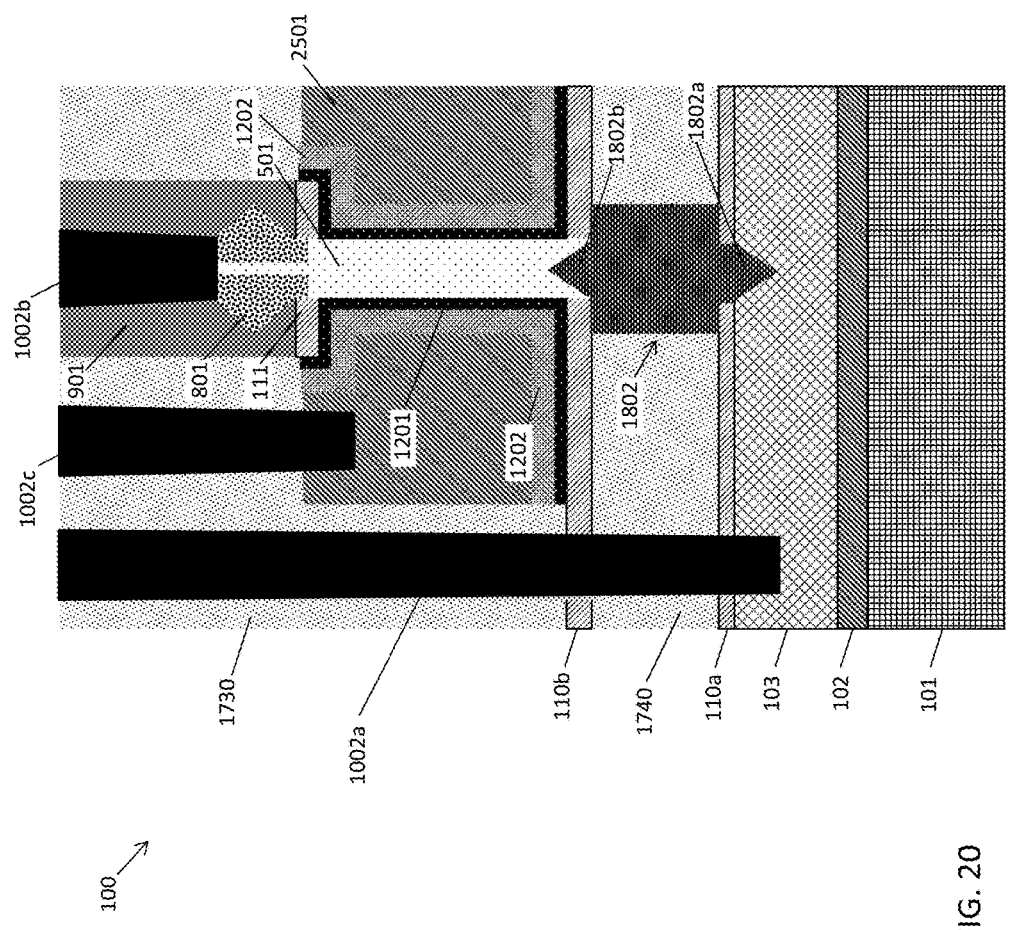

Turning to FIG. 20, the semiconductor structure 100 is illustrated after filling the first S/D trench 1000a, the gate trench 1000b and the second S/D trench 1000c with a metal material form a first S/D metal contact via 1002a, a gate metal contact via 1002b, and a second S/D metal contact via 1002c. The trenches (previously shown as elements 1000a-1000c) may be filled with a conductive material or a combination of conductive materials. The conductive material may be a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, may be performed to remove any conductive material from the surface of the first ILD 1730 and the S/D spacers 901.

Accordingly, various embodiments provide a semiconductor device that includes a stressor region having a different lattice constant compared to the channel region material. The stressor region induces a strain upon the channel region thereby providing a vertical FET having improving hole (or electron) mobility. In at least one embodiment, a sigma-etching process is utilized to form a self-limiting v-groove in the channel region near the bottom terminal of the vertical FET. The self-limiting v-groove assists in reducing the variations seen in conventional vertical FET fabrication processes. In addition, the self-limiting v-groove precisely controls the depth at which the stressor region extends into the channel region.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of inducing strain on a channel region of a vertical transistor, the method comprising:
   forming a channel region that extends from a first source/drain region to a second source/drain region;
   encapsulating a first portion of the channel region with a first encapsulating structure and a second portion of the channel region with a second encapsulating structure;
   removing the second encapsulating structure while maintaining the first encapsulating structure to expose the second portion of the channel region; and replacing the second portion of the channel region with a stressor region that induces a strain on the first portion of the channel region.

2. The method of claim 1, wherein the first encapsulating structure is a metal gate structure and the second encapsulating structure is an inter-layer dielectric (ILD) material, and wherein removing the second encapsulating structure includes selectively etching the second encapsulating structure while maintaining the second portion of the channel region.

3. The method of claim 1, wherein replacing the second portion of the channel region includes:
selectively etching the second portion of the channel region, the second portion extending from first source/drain region to the first portion of the channel region;
performing a sigma etching process that forms a first v-shaped groove in the first source/drain region and a second v-shaped groove in the first channel region; and
forming the stressor region having a first end that contacts the first source/drain region and a second end that contacts the first portion of the channel region.

4. The method of claim 3, wherein a width of the channel region controls a depth of the first and second v-shaped grooves self-terminates.

5. The method of claim 3, wherein forming the stressor region includes epitaxially growing a doped semiconductor material from the first source/drain region exposed by the first v-shaped groove and from the first portion of the channel region exposed by the second v-shaped groove, the doped semiconductor material having a lattice constant that is different from a lattice constant of the first portion of the channel region.

6. The method of claim 3, wherein forming the stressor region includes:
performing an atomic layer deposition process so as to deposit a doped semiconductor material extending from the first source/drain region exposed by the first v-shaped groove to the first portion of the channel region exposed by the second v-shaped groove; and
performing an anneal process so as to activate dopants in the semiconductor material such that a lattice constant of the stressor region is different from a lattice constant of the first channel portion.

7. The method of claim 5, wherein the first portion of the channel region comprises silicon (Si) and the doped semiconductor material of the stressor region comprises silicon germanium (SiGe) so as to induce a compressive strain on the channel region.

8. The method of claim 5, wherein the first portion of the channel region comprises silicon (Si) and the doped semiconductor material of the stressor region comprises carbon doped silicon (Si:C) so as to induce a tensile strain on the channel region.

9. A method of inducing a strain on a channel region of a vertical field effect transistor (FET), the method comprising:
removing an encapsulating structure to form a void that exposes a first portion of the channel region, the channel region having a first lattice constant;
selectively removing the first portion of the channel region while preserving a second portion of the channel region, the second portion having a first channel end connected to a first source/drain region and a second channel end exposed to the void; and
forming a stressor region having a first stressor end formed against the second channel and a second stressor end formed against a second source/drain region, the stressor region having a second lattice constant different from the first lattice constant so as to induce a strain on the preserved second portion of the channel region.

10. The method of claim 8, wherein the encapsulating structure is a metal gate structure, and wherein selectively removing the first portion of the channel region includes performing a sigma etch to form a first v-shaped groove that extends into the preserved second portion of the channel region.

11. The method of claim 9, wherein a width of the channel region controls a depth of the first and second v-shaped grooves self-terminates.

12. The method of claim 9, wherein forming the stressor region includes epitaxially growing a doped semiconductor material from the preserved second portion exposed by the v-shaped groove.

13. The method of claim 9, wherein forming the stressor region includes performing an atomic layer deposition process to deposit a doped semiconductor material in the first v-shaped groove so as to contact the preserved second portion of the channel region; and
performing a thermal anneal process so as to activate the doped semiconductor material.

14. The method of claim 9, wherein the preserved second portion of the channel region comprises silicon (Si) and the doped semiconductor material of the stressor region comprises silicon germanium (SiGe) so as to induce a compressive strain on the channel region.

15. The method of claim 9, wherein the preserved second portion of the channel region comprises silicon (Si) and the doped semiconductor material of the stressor region comprises carbon doped silicon (Si:C) so as to induce a tensile strain on the channel region.

* * * * *